United States Patent
Choi

(10) Patent No.: US 8,264,436 B2
(45) Date of Patent: Sep. 11, 2012

(54) GRAY SCALE VOLTAGE DECODER AND DIGITAL-TO-ANALOG CONVERTER INCLUDING THE SAME

(75) Inventor: Yoon-Kyung Choi, Yongin-si (KR)

(73) Assignee: Samsung Electronics Co., Ltd., Suwon-Si, Gyeonggi-Do ( * ) Notice: Subject to any disclaimer, the term of this patent is extended or adjusted under 35 U.S.C. 154(b) by 862 days.

(21) Appl. No.: 12/123,787

(22) Filed: May 20, 2008

(65) Prior Publication Data

US 2008/0291143 A1 Nov. 27, 2008

(30) Foreign Application Priority Data

May 21, 2007 (KR) .................. 10-2007-0049028

(51) Int. Cl.
*G09G 3/36* (2006.01)
(52) U.S. Cl. .......................... 345/89; 341/44
(58) Field of Classification Search .............. 345/89, 345/690, 98; 341/144
See application file for complete search history.

(56) References Cited

U.S. PATENT DOCUMENTS

| | | | |
|---|---|---|---|
| 2002/0171613 A1* | 11/2002 | Goto et al. | 345/87 |
| 2003/0043061 A1* | 3/2003 | Koyama et al. | 341/144 |
| 2008/0048935 A1* | 2/2008 | Yoshioka et al. | 345/55 |

FOREIGN PATENT DOCUMENTS

| | | |
|---|---|---|
| JP | 04-323914 | 11/1992 |
| JP | 2001127635 | 5/2001 |
| KR | 1020060096938 A | 9/2006 |
| KR | 1020060121114 A | 11/2006 |
| WO | WO2007058408 * | 5/2007 |

* cited by examiner

*Primary Examiner* — Kevin M Nguyen
*Assistant Examiner* — Sepideh Ghafari
(74) *Attorney, Agent, or Firm* — F. Chau & Associates, LLC

(57) ABSTRACT

A gray scale voltage decoder includes a first decoding unit and a second decoding unit, in which the first decoding unit includes row blocks. Each of the row blocks receives one of a number of gray scale voltages and determines whether to output the received gray scale voltage in response to first bits of digital image data provided through data input lines formed along a column direction. Row blocks outputting the received gray scale voltage according to the same values of the first bits are arranged adjacently. The first decoding unit selects part of the gray scale voltages to output the selected gray scale voltages. The second decoding unit selects one of the gray scale voltages selected by the first decoding unit in response to second bits of the digital image data and outputs the selected gray scale voltage.

18 Claims, 8 Drawing Sheets

GRAY SCALE VOLTAGE DECODER AND DIGITAL-TO-ANALOG CONVERTER INCLUDING THE SAME

CROSS-REFERENCE TO RELATED APPLICATION

This application claims priority under 35 USC §119 to Korean Patent Application No. 2007-0049028, filed on May 21, 2007 in the Korean Intellectual Property Office (KIPO), the disclosure of which is incorporated herein in its entirety by reference.

BACKGROUND OF THE INVENTION

1. Technical Field

The present disclosure relates to providing a gray scale voltage and, more particularly to a gray scale voltage decoder and a digital-to-analog converter including a gray scale voltage decoder for a display device.

2. Discussion of Related Art

A display device converts digital image data to analog image data and displays the converted image data in a plurality of pixels of a display panel. Recently, almost all electronic devices such as a computer, a television or various mobile devices include such a display device. Various researches have been performed for reducing a size of a drive circuit in the display device generally implemented with an integrated circuit.

FIG. 1 is a block diagram illustrating a known display device.

Referring to FIG. 1, the display device includes a data driver 110, a scan driver 120 and a liquid crystal display (LCD) panel 130. The data driver 110 includes a digital-to-analog converter 111. The digital-to-analog converter 111 provides gray scale voltages corresponding to digital image data IDATA to pixels in the liquid crystal display panel 130. The digital-to-analog converter 111 may include a gray scale voltage decoder. The gray scale voltage decoder can receive gray scale voltages, select one of the gray scale voltages according to pixel data of the digital image data IDATA, and output the selected gray scale voltage. The gray scale voltage decoder occupies a relatively large space in the display device.

FIG. 2 is a block diagram illustrating a conventional gray scale voltage decoder of a display device. It is assumed that one pixel data correspond to six bits in FIG. 2.

The gray scale voltage decoder 200 selects one of sixty-four gray scale voltages according to six-bit digital image data, that is, one pixel data, to output the selected gray scale voltage. Referring to FIG. 2, the gray scale voltage decoder 200 of the display device may have a hierarchical structure for reducing the chip size. The gray scale voltage decoder 200 includes a first decoding unit 210 and a second decoding unit 220.

The first decoding unit 210 selects some of the gray scale voltages in response to the lower three bits DS1 of the digital image data and outputs the selected gray scale voltages. The first decoding unit 210 includes row blocks RW11 through RW88. Each of the row blocks receives one of the gray scale voltages V0 through V63 and outputs the received gray scale voltage in response to the lower three bits DS1 of the digital image data.

The second decoding unit 220 receives the gray scale voltages selected by the first decoding unit 210, selects one of the selected gray scale voltages in response to upper three bits DS2 of the digital image data and outputs the selected one gray scale voltage, which is an analog signal OUT.

FIG. 3 is a circuit diagram illustrating the gray scale voltage decoder 200 shown in FIG. 2 implemented with NMOS transistors.

Referring to FIG. 3, each of the row blocks RW11 through RW88 included in the gray scale voltage decoder 200 shown in FIG. 2 may be implemented with NMOS transistors. The NMOS transistors may be serially coupled in each of the row blocks of the first decoding unit 210. Each of the NMOS transistors receives, through a gate terminal, one bit of the digital image data D0, D0B, D1, D1B, D2, D2B, D3, D3B, D4, D4B, D5 and D5B representing the lower three bits DS1 of the digital image data.

FIG. 4 is a circuit diagram illustrating row blocks included in the first decoding block 210 implemented as an integrated circuit.

In the portion of the conventional gray scale voltage decoder shown in FIG. 4, adjacent row blocks RW11 and RW12 may operate in response to different bits of the digital image data. Thus, even when some row blocks are not affected by some bits of the digital image data, the input lines DL0 through DL5 need to pass through all the row blocks in order to provide some of the bits of the digital image data to the other row blocks located adjacently. Accordingly, dummy transistors MND are inserted between active transistors MNA that are actually performing the switching operations in response to the digital image signal. In forming the dummy transistors MND, source terminals and drain terminals of the dummy transistors MND are merged to form short circuits. The dummy transistors are inserted because an implementation of the integrated circuit without the dummy transistors needs more intervals, according to design rules, between the input lines DL0 through DL5 passing through the active transistors MNA1 through MNA6 and the empty space.

The dummy transistors, which do not perform switching operations, occupy a large circuit area.

SUMMARY OF THE INVENTION

Accordingly, exemplary embodiments of the present invention are provided to substantially obviate one or more problems due to limitations and disadvantages of the related art.

Exemplary embodiments of the present invention provide a gray scale voltage decoder reducing a size of an integrated circuit by rearranging row blocks for eliminating dummy transistors.

Exemplary embodiments of the present invention provide a digital-to-analog converter reducing a size of an integrated circuit by rearranging row blocks for eliminating dummy transistors.

In exemplary embodiments of the present invention, a gray scale voltage decoder includes a first decoding unit and a second decoding unit. The first decoding unit selects part of the gray scale voltages to output the selected gray scale voltages. The first decoding unit includes row blocks. Each of the row blocks receives one of gray scale voltages and determines whether to output the received gray scale voltage in response to first bits of digital image data. The digital image data are provided through data input lines formed along a column direction. The row blocks outputting the received gray scale voltage in response to the same values of the first bits are arranged adjacently. The second decoding unit selects one of the gray scale voltages selected by the first decoding unit in response to second bits of the digital image data to output the selected gray scale voltage.

Each of the row blocks includes switches for determining whether to output the received gray scale voltage in response to the first bits of the digital image data.

The switches may be serially coupled. Each of the switches may be operated in response to one bit of the first bits of the digital image data.

Each of the switches includes an MOS transistor and has a gate terminal coupled to one of the data input lines to receive the one bit of the first bits of the digital image data, the MOS transistor receives the gray scale voltage through a first terminal of a source terminal and a drain terminal. The MOS transistor may output the received gray scale voltage through a second terminal of the source terminal and a drain terminal.

Each of the row blocks may include serially coupled MOS transistors turned on or off in response to the first bits. All of the MOS transistors may correspond to active transistors that are distinguished from dummy transistors.

The row blocks may be separately located so as to be divided into at least two column line shapes.

In exemplary embodiments of the present invention, a digital-to-analog converter of a display device includes a gray scale voltage generator, a first decoding unit, and a second decoding unit. The gray scale voltage generator includes serially coupled resistors. The gray scale voltage generator generates gray scale voltages by sequentially dividing a reference voltage using a plurality of resistors. The first decoding unit selects part of the gray scale voltages to output the selected gray scale voltages. The first decoding unit includes row blocks. Each of the row blocks receives one of the gray scale voltages and determines whether to output the received gray scale voltage in response to first bits of digital image data. The digital image data are provided through data input lines formed along a column direction. The row blocks outputting the received gray scale voltage according to the same values of the first bits are arranged adjacently. The second decoding unit selects one of the gray scale voltages selected by the first decoding unit in response to second bits of the digital image data to output the selected gray scale voltage.

Therefore the gray scale voltage decoder of the display device and the digital-to-analog converter including the same may reduce a circuit size.

BRIEF DESCRIPTION OF THE DRAWINGS

Exemplary embodiments of the present invention will be understood in more detail from the following descriptions taken in conjunction with the attached drawings.

DESCRIPTION OF EXEMPLARY EMBODIMENTS

Figure 1:
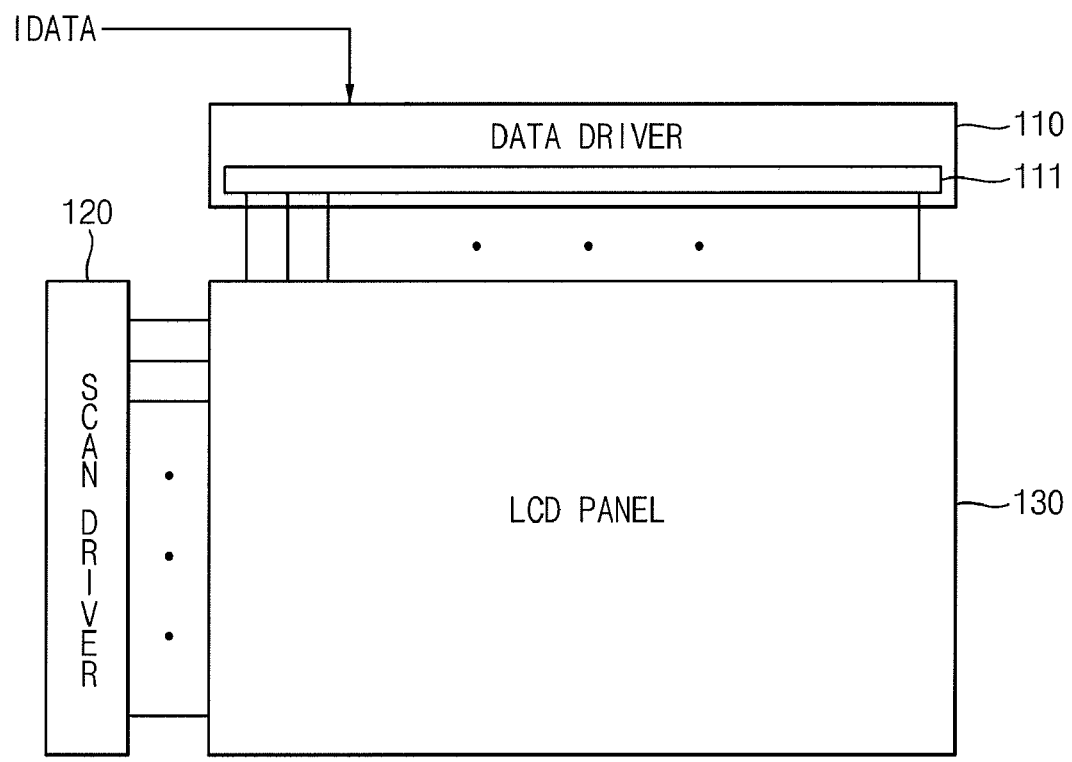
FIG. 1 is a block diagram illustrating a conventional display device.

Exemplary embodiments of the present invention now will be described more fully with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

Figure 5:
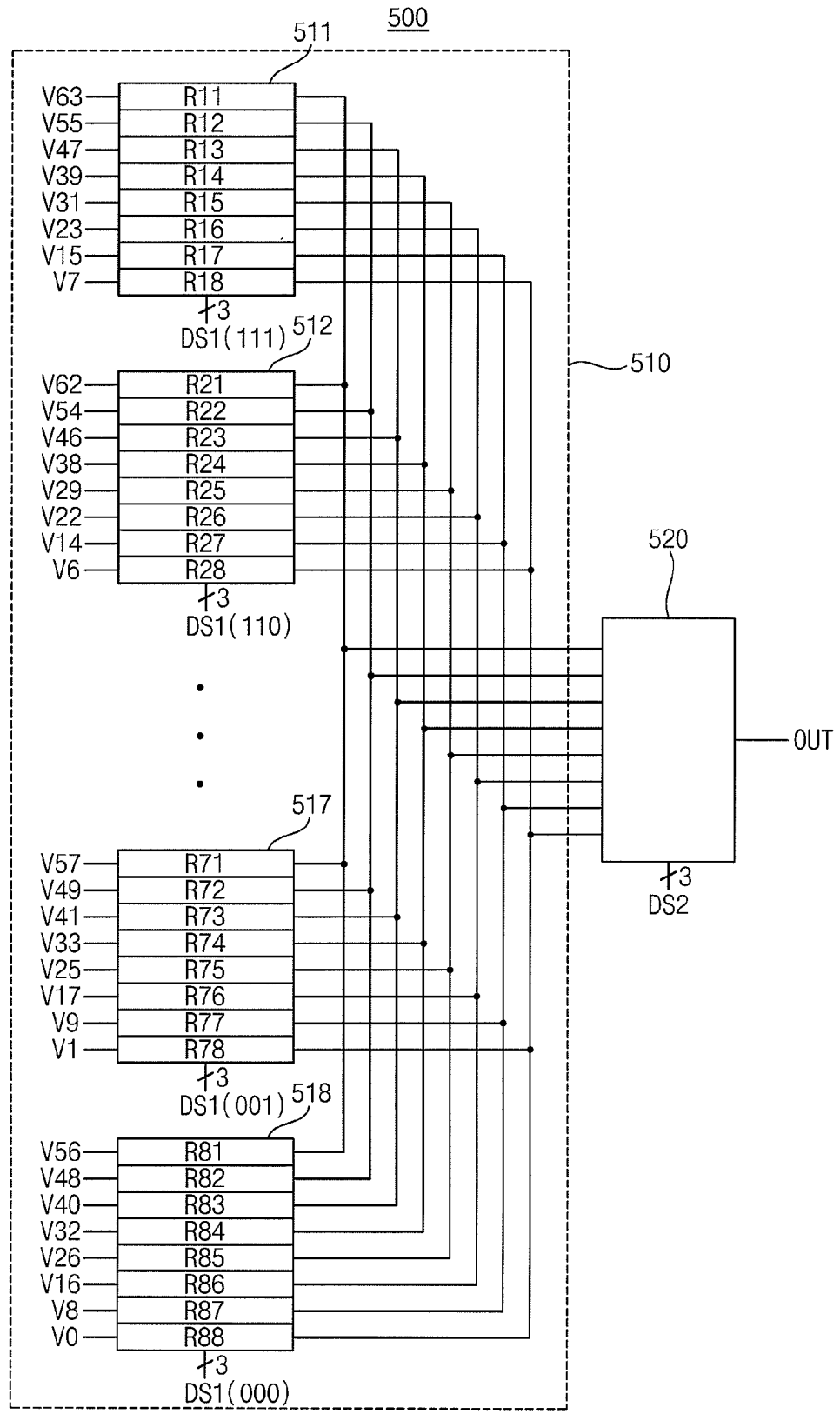
FIG. 5 is a block diagram illustrating a gray scale voltage decoder according to an exemplary embodiment of the present invention.

FIG. 5 is a block diagram illustrating a gray scale voltage decoder according to an exemplary embodiment of the present invention.

Referring to FIG. 5, the gray scale voltage decoder 500 includes a first decoding unit 510 and a second decoding unit 520. The gray scale voltage decoder 500 has a hierarchical structure. An integrated circuit size may be reduced by implementing the gray scale voltage decoder 500 hierarchically with divided decoding units 510 and 520 so that active elements performing the same function may be omitted.

In FIG. 5, it is assumed that one pixel data corresponds to six bits for convenience of description. The gray scale voltage decoder 500 in FIG. 5 outputs one of sixty-four gray scale voltages as an analog signal in response to six-bit digital image data. First bits DS1 corresponding to the lower three bits of the digital image data are provided to the first decoding unit 510. Second bits DS2 corresponding to the upper three bits of the digital image data are provided to the second decoding unit 520. The first decoding unit 510 selects eight gray scale voltages of the sixty-four gray scale voltages in response to the first bits DS1 of digital image data and outputs the selected eight gray scale voltages. The second decoding unit 520 selects one gray scale voltage of the eight gray scale voltages provided from the first decoding unit 510 in response to the second bits DS2 of digital image data and outputs the selected one gray scale voltage OUT.

The number of gray scale voltages and the number of bits of digital image data may be modified according to exemplary embodiments. For example, the display device may display $2^{18}$ colors when the digital image data includes six bits for red color, six bits for green color, and six bits for blue color and sixty-four gray scale voltages are used for representing each color, as illustrated in the gray scale voltage decoder 500. In an exemplary embodiment, the display device may display $2^{24}$ colors when eight bits of digital image data are used respectively for representing red color, green color and blue color with 256, that is, $2^8$, gray scale voltages.

The first decoding unit 510 includes row block groups 511, 512 through 517, 518. A first row block group 511 includes row blocks R11 through R18, a second row block group 512 includes R21 through R28, a third row block group (not shown) includes R31 through R38, a fourth row block group (not shown) includes R41 through R48, a fifth row block group (not shown) includes R51 through R58, a sixth row block group (not shown) includes R61 through R68, a seventh row block group 517 includes R71 through R78, and an eighth row block group 518 includes R81 through R88. In a description of an exemplary embodiment of the present invention, each row block group includes row blocks that are arranged adjacently and outputs the received gray scale voltages simultaneously in response to the same values of the first bits DS1 of the digital image data.

Each row block receives one of the gray scale voltages V0-V63 and outputs the received gray scale voltage in response to the first bits DS1 of the digital image data.

All of the row blocks R11 through R18 included in the first row block group 511 output the received gray scale voltages simultaneously according to the same value of the first bits DS1 of the digital image data. As such, row blocks outputting the received gray scale voltages according to the same value of the first bits DS1 of the digital image data are arranged adjacently. For example, row blocks R11 through R18 arranged adjacently in the first row block group 511 in FIG. 5 output the received gray scale voltages only when the first bits DS1 of the digital image data correspond to "111". Row blocks R21 through R28 arranged adjacently in the second row block group 512 output the received gray scale voltages only when the first bits DS1 of the digital image data correspond to "110". As such, row blocks R81 through R88 located adjacently in the eighth row block group 512 output the received gray scale voltages only when the first bits DS1 of the digital image data correspond to "000".

Figure 2:
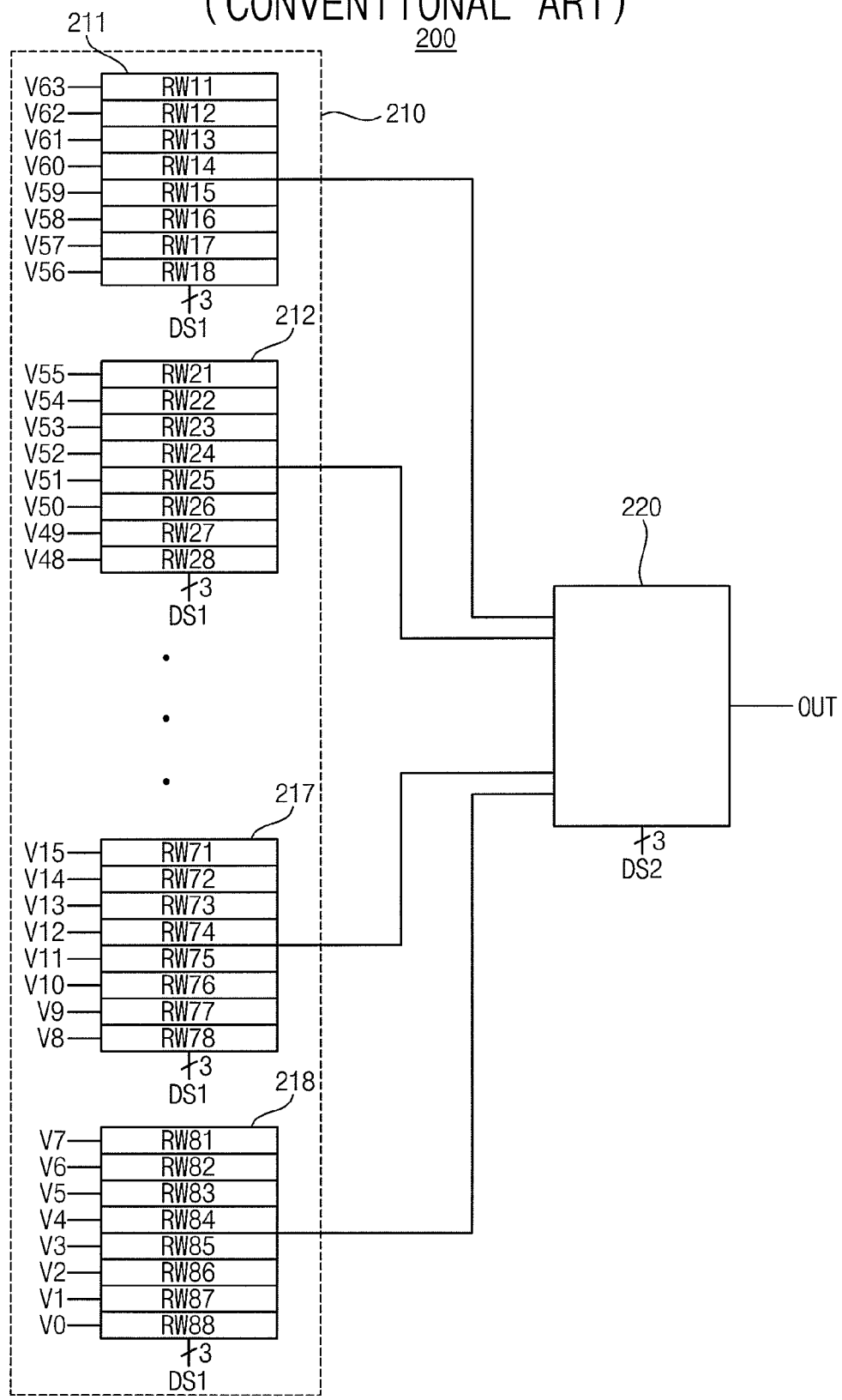
FIG. 2 is a block diagram illustrating a conventional gray scale voltage decoder of a display device.
Figure 3:
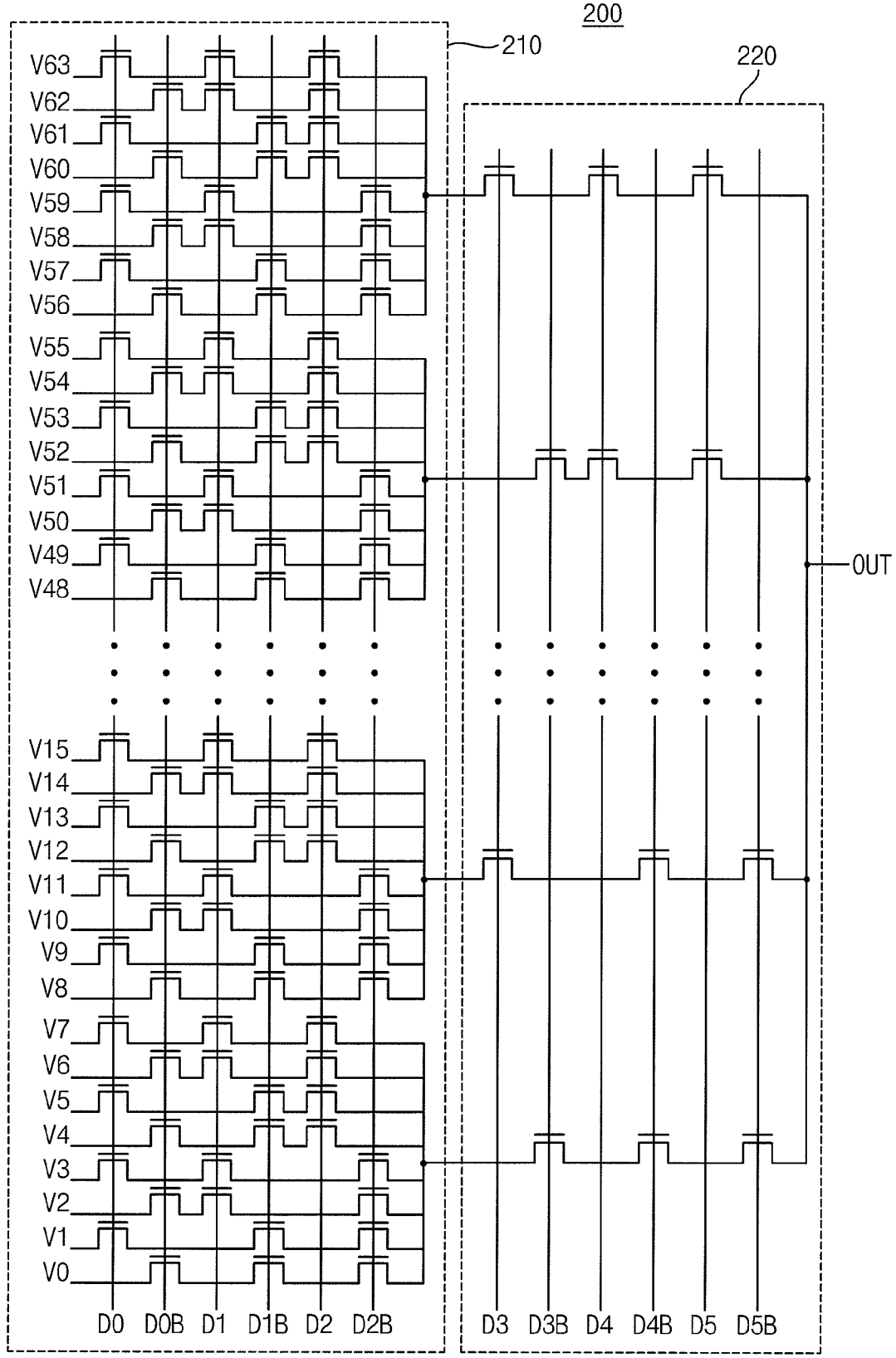
FIG. 3 is a circuit diagram illustrating the conventional gray scale voltage decoder shown in FIG. 2 implemented with NMOS transistors.

In the first decoding unit 210 of the conventional gray scale voltage decoder 200 shown in FIG. 2, adjacent row blocks may output the received gray scale voltages when the first bits of the digital image data have different values. Thus, switches are arranged differently in the adjacent row blocks. Accordingly, the conventional gray scale voltage decoder needs the dummy transistors as described above. In an exemplary embodiment of the present invention, however, the gray scale voltage decoder does not need dummy transistors, because the row blocks arranged adjacently are controlled by the same value of the first bits DS1.

The second decoding unit 520 selects one of the gray scale voltages selected by the first decoding unit 510 in response to the second bits DS2 to output the selected gray scale voltage as an analog signal OUT.

Figure 6:
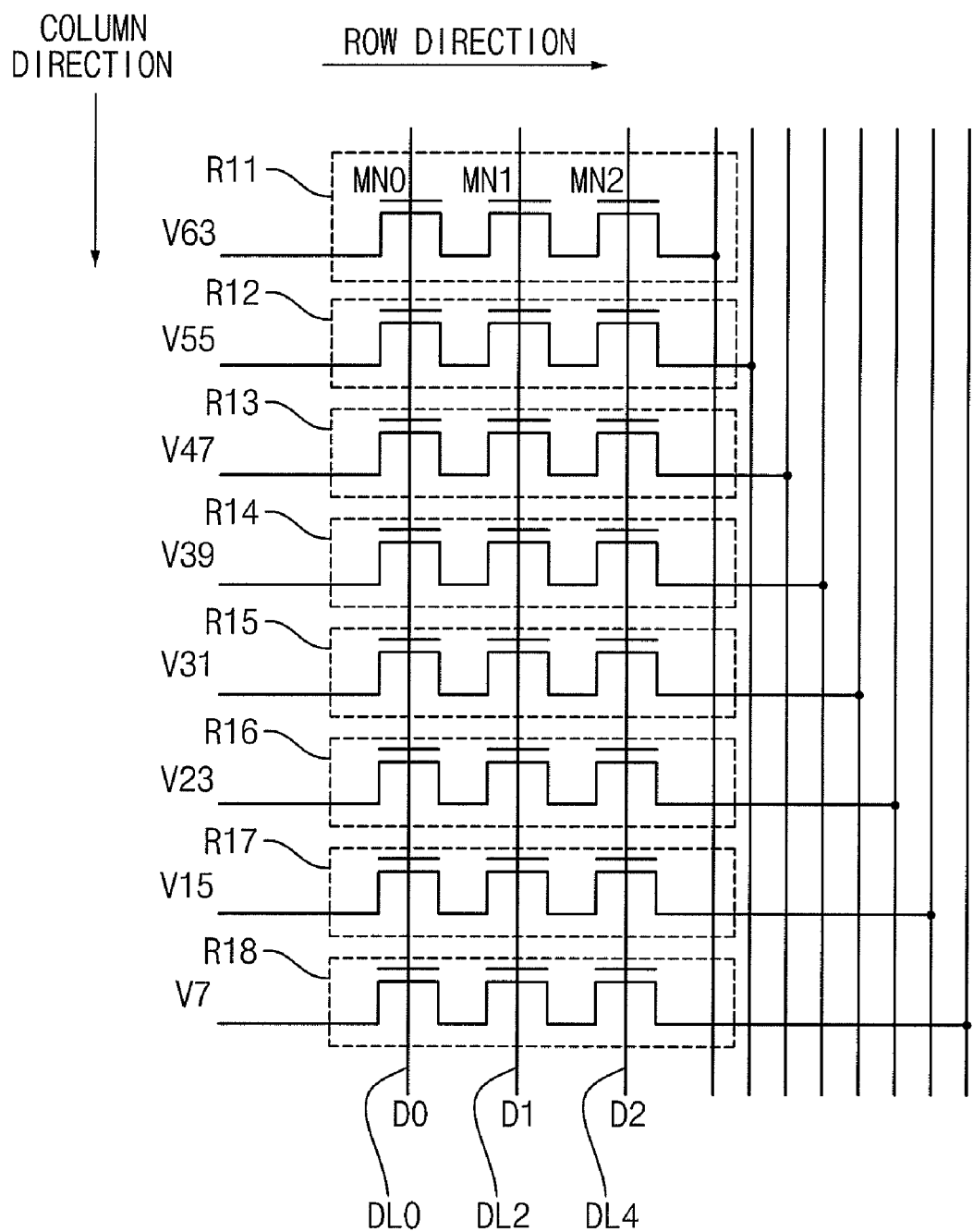
FIG. 6 is a circuit diagram illustrating a row block group implemented with NMOS transistors in the first decoding unit of the gray scale voltage decoder shown in FIG. 5.

FIG. 6 is a circuit diagram illustrating a row block group 511 implemented with NMOS transistors in the first decoding unit 510 of the gray scale voltage decoder 500 shown in FIG. 5.

Referring to FIG. 6, the first row block group receives the same bits D0, D1 and D2 of the first bits DS1 of the digital image data provided through data lines DL0, DL2 and DL4 formed along a column direction.

The row blocks R11 through R18 arranged adjacently in the first row block group 511 receive the gray scale voltages V7, V15, V23, V31, V39, V47, V55 and V63, respectively, and determine whether to output the received gray scale voltage in response to the same bits D0, D1, and D2. For determining whether to output the received gray scale voltage, each of the row blocks R11 through R18 may have switches outputting the received signal in response to the same bits D0, D1, and D2 of the digital image data.

The switches may be implemented with NMOS transistors as illustrated in FIG. 6. For example, the first row block R11 includes three NMOS transistors MN0, MN1 and MN2. The three NMOS transistors MN0, MN1, and MN2 are serially coupled. Gate terminals of the three NMOS transistors MN0, MN1, and MN2 are respectively coupled to data input lines DL0, DL2, and DL4. Each of the three NMOS transistors MN0, MN1, and MN2 receives each bit D0, D1, and D2 of the first bits through each gate terminal to determine whether to output the received gray scale voltages.

In the gray scale voltage decoder 500 according to an exemplary embodiment of the present invention, all the row blocks R11 through R18 receiving the same bits D0, D1, and D2 of the first bits are arranged adjacently in order to output the received gray scale voltages according to the same value of the same bits D0, D1, and D2. Thus, switches included in the adjacent row blocks may be implemented with the same arrangement.

Figure 4:
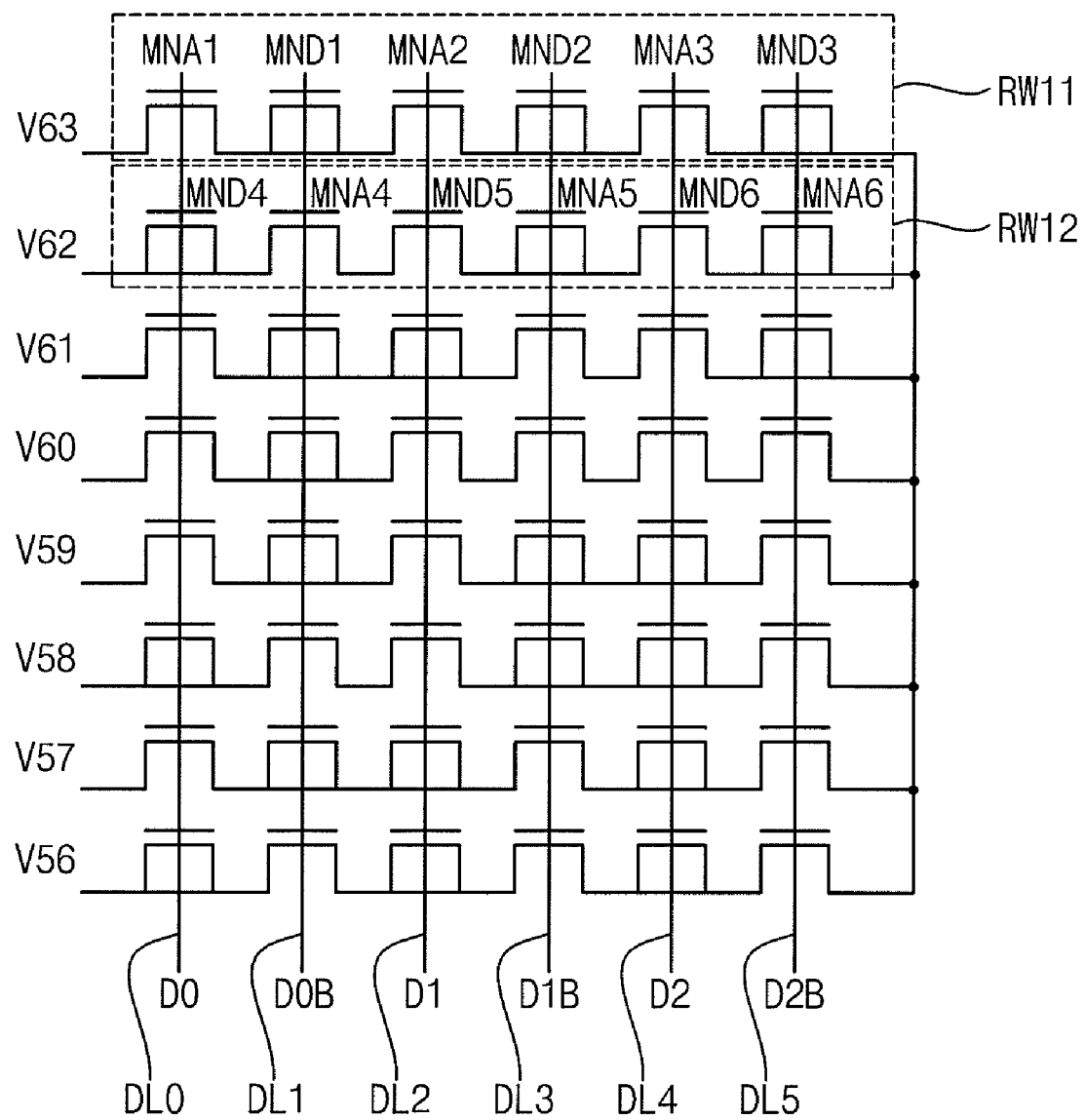
FIG. 4 is a circuit diagram illustrating row blocks included in a first decoding block of the conventional grayscale decoder implemented as an integrated circuit.

In the conventional gray scale voltage decoder shown in FIG. 4, adjacent row blocks may receive different bits of the digital image data. Thus, even when some row blocks are not affected by some bits of the digital image data, the input lines DL0 through DL5 need to pass through all the row blocks in order to provide some of the bits of the digital image data to the other row blocks located adjacently. Thus, dummy transistors have to be inserted between active transistors that are actually performing the switching operations, so that the input lines DL0 through DL5 pass through spaces between the active transistors.

In the gray scale voltage decoder according to an exemplary embodiment of the present invention shown in FIG. 6, adjacent row blocks may receive the same values of the first bits of the digital image data provided through the same bit lines. It is not necessary to consider spaces for input lines to provide the digital image data to some row blocks that are not affected by some bits of the digital image data. The dummy transistors are not required for passage of irrelevant input lines, and thus a size of the integrated circuit may be reduced. More specifically, a row direction length of the integrated circuit may be reduced by eliminating the dummy transistors.

In addition, a load capacitance of a level shifter driving the input lines may be reduced, because the number of transistors coupled to one input line is reduced. Thus, dynamic current and malfunction caused by so-called ground bouncing may be reduced.

The input lines may include inverting input lines for turning on the transistor at a logic low state and non-inverting input lines for turning on the transistor at a logic high state. The first row block group 511 receives each bit of the first bits DS1 through three non-inverting input lines DL0, DL2, and DL4 to turn on all the transistors when the first bits DS1 correspond to "111". Other row block groups, such as the second row block group 512 through the eighth row block group 518 illustrated in FIG. 5, however, may receive the first bits DS1 through different combinations of input lines. For example, the second row block group 512 may receive each bit of the first bits DS1 through two non-inverting input lines and one inverting input line to turn on all the transistors when the first bits correspond to "110". The eighth row block group 518 in FIG. 5 may receive each bit of the first bits DS1 through the three inverting input lines to turn on all the transistors when the first bits DS1 correspond to "000". Configurations for combinations of input lines for providing the first bits DS1 to the row block groups 511 through 518 may be modified according to various exemplary embodiments.

Figure 7:
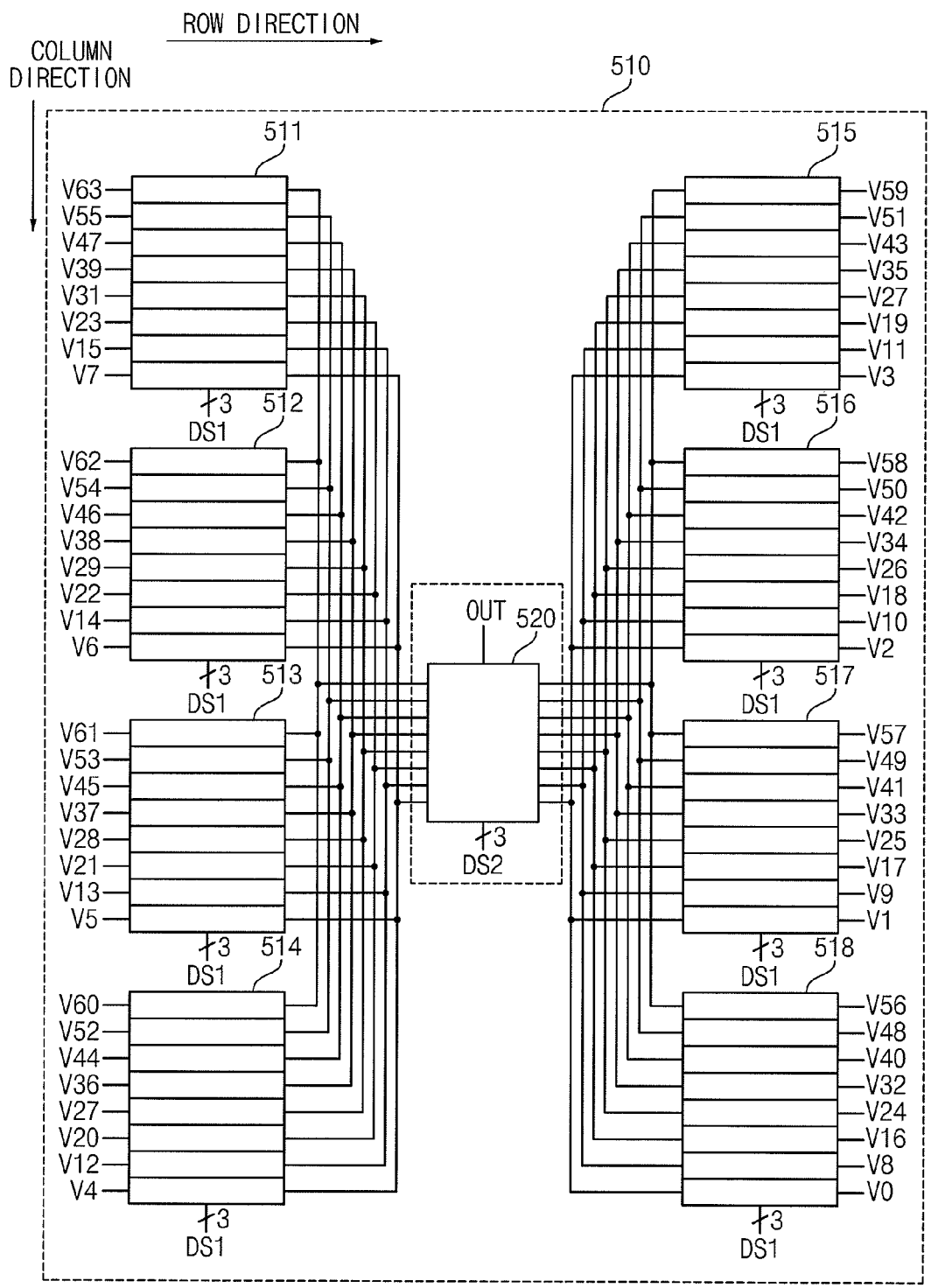
FIG. 7 is a block diagram illustrating a gray scale voltage decoder for reducing a column direction length according to an exemplary embodiment of the present invention.

FIG. 7 is a block diagram illustrating a gray scale voltage decoder for reducing a column direction length according to an exemplary embodiment of the present invention.

Referring to FIG. 7, some row block groups 515, 516, 517, and 518 of the row block groups 511 through 518 included in the first decoding unit 510 shown in FIG. 5 may be separately located with respect to the other row block groups 511, 512, 513, and 514. In other words, row block groups 511 through 518 may be divided into two different column line shapes as illustrated in FIG. 7. The column direction length of the gray scale voltage decoder shown in FIG. 7 is shorter than a column direction length of the gray scale voltage decoder shown in FIG. 5. According to exemplary embodiments, the row blocks may be separately arranged in three or more column line shapes for further reducing the column direction length.

Figure 8A:
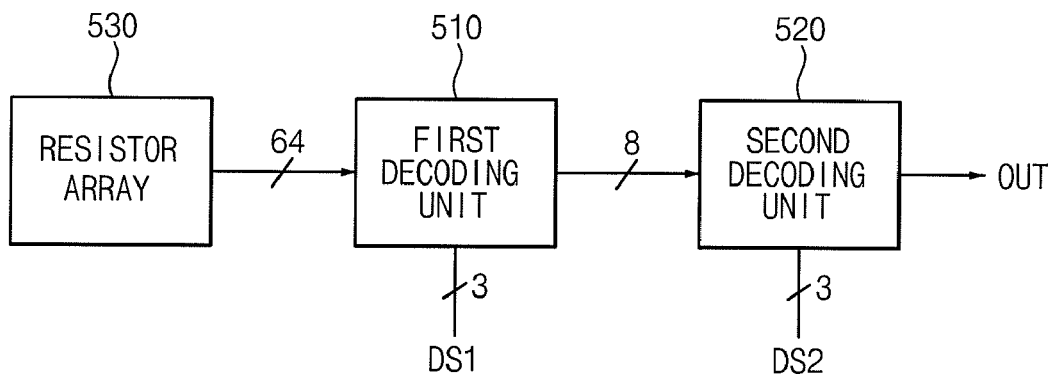
FIG. 8A and FIG. 8B are block diagrams illustrating digital-to-analog converters according to exemplary embodiments of the present invention.
Figure 8B:
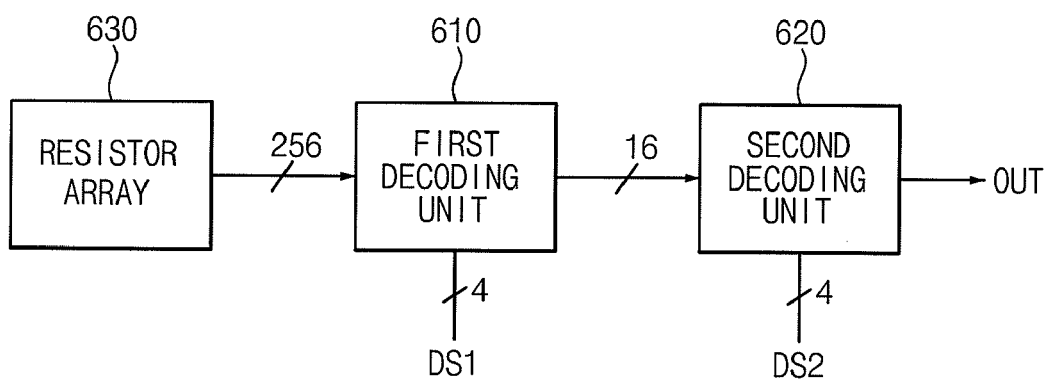

FIGS. 8A and 8B are block diagrams illustrating digital-to-analog converters according to exemplary embodiments of the present invention.

Referring to FIG. 8A, a digital-to-analog converter includes a first decoding unit 510, a second decoding unit 520, and a resistor array 530 functioning as a gray scale voltage generator.

The first decoding unit 510 and the second decoding unit 520 are similar to the first decoding unit and the second decoding unit illustrated in FIG. 5 or FIG. 7. The first decoding unit 510 and the second decoding unit 520 may reduce the size of the integrated circuit as described with respect to FIGS. 5 and 7. The resistor array 530 generates sixty-four gray scale voltages provided to the first decoding unit 510. The gray scale voltage generator implemented as the resistor array 530 includes serially coupled resistors (not shown) for sequentially dividing a reference voltage to generate different gray scale voltages, as is well known to those of ordinary skill in the art.

Referring to 8A, the gray scale voltage generator in the form of the resistor array 530 generates sixty-four gray scale voltages. The first decoding unit 510 selects eight gray scale voltages according to the lower three bits DS1 of the digital image data. The second decoding unit 520 selects one gray scale voltage according to upper three bits DS2 of the digital image data to output the selected gray scale voltage.

Referring to 8B, the gray scale voltage generator in the form of a resistor array 630 generates 256 gray scale voltages. A first decoding unit 610 selects sixteen gray scale voltages according to the lower four bits DS1 of the digital image data. A second decoding unit 520 selects one gray scale voltage according to the upper four bits DS2 of the digital image data to output the selected gray scale voltage.

The number of gray scale voltages and bits of the digital image data illustrated in FIG. 8A or FIG. 8B and the division of lower bits and upper bits of the digital image data are illustrative and may be modified according to various exemplary embodiments.

As described above, the gray scale voltage decoder of the display device and the digital-to-analog converter including the same can reduce the circuit size by rearranging the row blocks so as to eliminate the dummy transistors.

In addition, the gray scale voltage decoder of the display device and the digital-to-analog converter including the same can reduce the number of transistors coupled to one input line, thereby reducing a load capacitance of a level shifter for driving the input line. Accordingly a dynamic current may be reduced, and a malfunction caused by the so-called ground bouncing may be prevented.

While exemplary embodiments of the present invention and their advantages have been described in detail, it should be understood that various changes, substitutions and alterations may be made herein without departing from the scope of the present invention.

What is claimed is:

1. A gray scale voltage decoder comprising:
   a first decoding unit including row blocks configured to select part of gray scale voltages and output the selected gray scale voltages, each of the row blocks configured to receive one of the gray scale voltages and determine whether to output the received gray scale voltage in response to first bits of digital image data, the digital image data being provided through data input lines formed along a column direction; and
   a second decoding unit configured to select one of the gray scale voltages selected by the first decoding unit in response to second bits of the digital image data and to output the selected gray scale voltage, the second bits separate from the first bits,
   wherein each of the row blocks comprises a switch corresponding to each of the first bits for outputting the received gray scale voltage, the switch being responsive to the first bits applied to each respective switch in each row block,
   wherein the first decoding unit includes row block groups, each of the row block groups including some of the row blocks that are arranged adjacently, each of the row blocks included in a same row block group outputting the received gray scale voltage in response to the same values of the first bits, the switches included in the row blocks in the same row block group being implemented with a same arrangement.

2. The gray scale voltage decoder of claim 1, wherein the switches are serially coupled, and each of the switches is operated in response to one bit of the first bits of the digital image data.

3. The gray scale voltage decoder of claim 2, wherein each of the switches includes an MOS transistor having a gate terminal coupled to one of the data input lines to receive the one bit of the first bits of the digital image data, the MOS transistor receives the gray scale voltage through a first one of a source terminal and a drain terminal, and the MOS transistor outputs the received gray scale voltage through a second one of the source terminal and the drain terminal.

4. The gray scale voltage decoder of claim 1, wherein each of the row blocks includes serially coupled MOS transistors turned on/off in response to the first bits, and wherein all the MOS transistors are turned on/off in response to one bit of the first bits.

5. The gray scale voltage decoder of claim 1, wherein the row blocks are separately located and are divided into at least two column line shapes.

6. The gray scale voltage decoder of claim 5, wherein each of the row blocks includes switches for determining whether to output the received gray scale voltage in response to the first bits of the digital image data.

7. The gray scale voltage decoder of claim 5, wherein the switches are serially coupled, and each of the switches is operated in response to one bit of the first bits of the digital image data.

8. The gray scale voltage decoder of claim 7, wherein each of the switches includes an MOS transistor having a gate terminal coupled to one of the data input lines to receive the one bit of the first bits of the digital image data, and wherein the MOS transistor receives the gray scale voltage through a first one of a source terminal and a drain terminal, and the MOS transistor outputs the received gray scale voltage through a second one of the source terminal and the drain terminal.

9. The gray scale voltage decoder of claim 5, wherein each of the row blocks includes serially coupled MOS transistors turned on or off in response to the first bits, all of the MOS transistors corresponding to active transistors that are distinguished from dummy transistors.

10. The gray scale voltage decoder of claim 1, wherein the first bits correspond to lower bits of the digital image data and the second bits correspond to upper bits of the digital image data.

11. The gray scale voltage decoder of claim 10, wherein the digital image data comprise six bits, and wherein the first bits correspond to lower three bits of the digital image data, the second bits correspond to upper three bits of the digital image data, and a number of the gray scale voltages corresponds to sixty four.

12. The gray scale voltage decoder of claim 10, wherein the digital image data comprise eight bits, and wherein the first bits correspond to lower four bits of the digital image data, the second bits correspond to upper four bits of the digital image data and a number of the gray scale voltages correspond to 256.

13. A digital-to-analog converter of a display device, comprising:
- a gray scale voltage generator configured to generate gray scale voltages by sequentially dividing a reference voltage using a plurality of resistors;
- a first decoding unit including row blocks configured to select part of the gray scale voltages to output the selected gray scale voltages, each of the row blocks configured to receive one of the gray scale voltages and determine whether to output the received gray scale voltage in response to first bits of digital image data, the digital image data being provided through data input lines formed along a column direction; and
- a second decoding unit configured to select one of the gray scale voltages selected by the first decoding unit in response to second bits of the digital image data and to output the selected the gray scale voltage, the second bits separate from the first bits,
- wherein each of the row blocks comprises a switch corresponding to each of the first bits for outputting the received gray scale voltage, the switch being responsive to the first bits applied to each respective switch in each row block,
- wherein the first decoding unit includes row block groups, each of the row block groups including some of the row blocks that are arranged adjacently, each of the row blocks included in a same row block group outputting the received gray scale voltage in response to the same values of the first bits, the switches included in the row blocks in the same row block group being implemented with a same arrangement.

14. The digital-to-analog converter of claim 13, wherein the switches are serially coupled, and each of the switches is operated in response to one bit of the first bits of the digital image data.

15. The digital-to-analog converter of claim 14, wherein each of the switches includes an MOS transistor having a gate terminal coupled to one of the data input lines to receive the one bit of the first bits of the digital image data, the MOS transistor receives the gray scale voltage through a first one of a source terminal and a drain terminal, and the MOS transistor outputs the received gray scale voltage through a second one of the source terminal and the drain terminal.

16. The digital-to-analog converter of claim 13, wherein each of the row blocks includes serially coupled MOS transistors turned on or off in response to the first bits, all the MOS transistors corresponding to active transistors that are distinguished from dummy transistors.

17. The digital-to-analog computer of claim 13, wherein the first bits correspond to lower bits of the digital image data and the second bits correspond to upper bits of the digital image data.

18. The digital-to-analog converter of claim 17, wherein the digital image data comprise six bits, the first bits correspond to lower three bits of the digital image data, the second bits correspond to upper three bits of the digital image data, and a number of the gray scale voltages correspond to sixty four.

* * * * *